US012327772B2

(12) United States Patent
Yeh et al.

(10) Patent No.: US 12,327,772 B2
(45) Date of Patent: Jun. 10, 2025

(54) SEMICONDUCTOR PACKAGE INCLUDING STRESS-REDUCTION STRUCTURES AND METHODS OF FORMING THE SAME

(71) Applicant: Taiwan Semiconductor Manufacturing Company Limited, Hsinchu (TW)

(72) Inventors: Shu-Shen Yeh, Taoyuan (TW); Yu-Sheng Lin, Zhubei (TW); Ming-Chih Yew, Hsinchu (TW); Po-Yao Lin, Zhudong Township (TW); Shin-Puu Jeng, Po-Shan Village (TW); Chin-Hua Wang, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 333 days.

(21) Appl. No.: 17/749,198

(22) Filed: May 20, 2022

(65) Prior Publication Data

US 2023/0137164 A1    May 4, 2023

Related U.S. Application Data

(60) Provisional application No. 63/274,972, filed on Nov. 3, 2021.

(51) Int. Cl.
*H01L 23/10*    (2006.01)
*H01L 23/16*    (2006.01)
*H01L 23/467*    (2006.01)

(52) U.S. Cl.
CPC .............. *H01L 23/10* (2013.01); *H01L 23/16* (2013.01); *H01L 23/467* (2013.01)

(58) Field of Classification Search
CPC ......... H01L 23/10; H01L 23/34; H01L 23/36; H01L 23/367; H01L 23/3675;
(Continued)

(56) References Cited

U.S. PATENT DOCUMENTS

2020/0051954 A1* 2/2020 Kim ................... H01L 27/14636
2022/0013487 A1* 1/2022 Kim ....................... H01L 24/97

FOREIGN PATENT DOCUMENTS

JP         2003218253 A  *  7/2003  ....... H01L 2924/163
WO    WO-2022194217 A1  *  9/2022

OTHER PUBLICATIONS

English Translation of "Package for Storing Semiconductor Element and Semiconductor Device", JP 2003218253 A (Year: 2002).*
(Continued)

*Primary Examiner* — Evan G Clinton
*Assistant Examiner* — Douglas Yap
(74) *Attorney, Agent, or Firm* — The Marbury Law Group, PLLC

(57) ABSTRACT

A semiconductor package includes a package substrate; semiconductor devices disposed on the package substrate; a package ring disposed on a perimeter of package substrate surrounding the semiconductor devices; a cover disposed over the package ring and the semiconductor devices; a cover adhesive bonding the cover to the package ring; and a stress-reduction structure including first channels formed in an upper surface of the package ring and second channels formed in a lower surface of a portion of the cover that overlaps with the first channels.

20 Claims, 13 Drawing Sheets

(58) Field of Classification Search
CPC ....... H01L 23/46; H01L 23/467; H01L 23/04; H01L 23/053; H01L 23/055; H01L 23/057; H01L 23/16; H01L 23/562; H01L 23/20; H01L 23/26; H05K 5/0213; H05K 5/0217

See application file for complete search history.

(56) References Cited

OTHER PUBLICATIONS

English Translation for "Chip Package and Heat Dissipation Assembly for Suppresing Electromagnetic Radiation" (WO 2022194217 A1) (Year: 2022).*

* cited by examiner

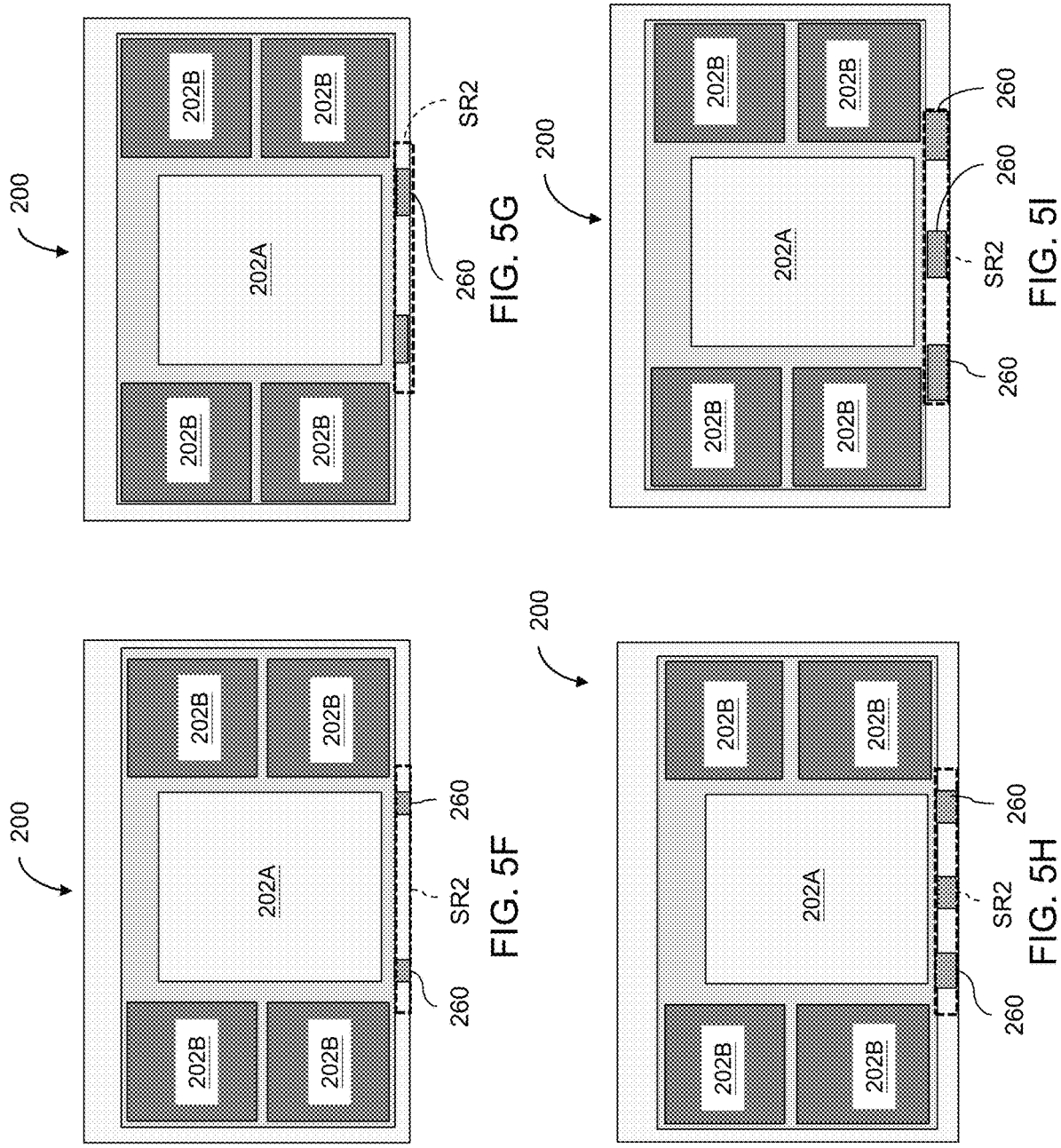

SEMICONDUCTOR PACKAGE INCLUDING STRESS-REDUCTION STRUCTURES AND METHODS OF FORMING THE SAME

RELATED APPLICATIONS

This application claims the benefit of priority from a U.S. provisional application Ser. No. 63/274,972, titled "Semiconductor Package Including Stress-Reduction Structures and Methods for Forming the Same," filed on Nov. 3, 2021, the entire contents of which are incorporated herein by reference.

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

In addition to smaller electronic components, improvements to the packaging of components seek to provide smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these 3D devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5B-5I are simplified horizontal cross sectional views of the semiconductor package 200, showing various locations where stress-reduction structures 260 may be formed according to various embodiments.

6A is a simplified horizontal cross sectional view of a semiconductor package 600 including an alternative stress-reduction structure 660, according to various embodiments of the present disclosure.

Figure 6A:
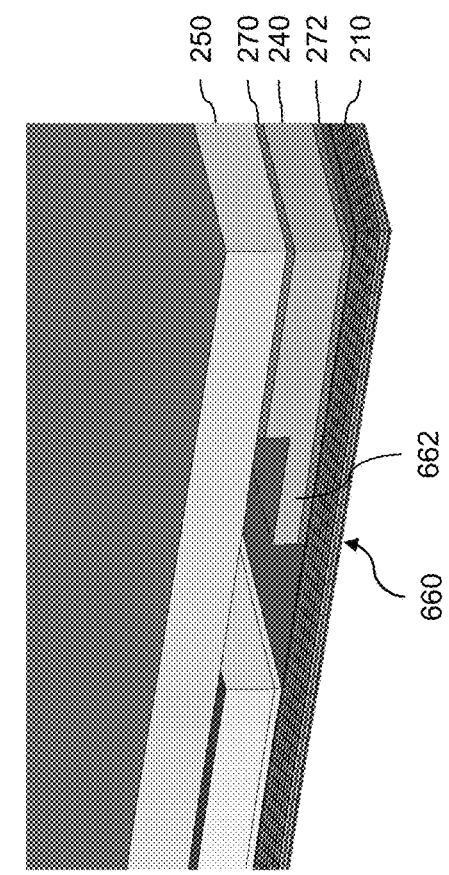
Figure 6B:
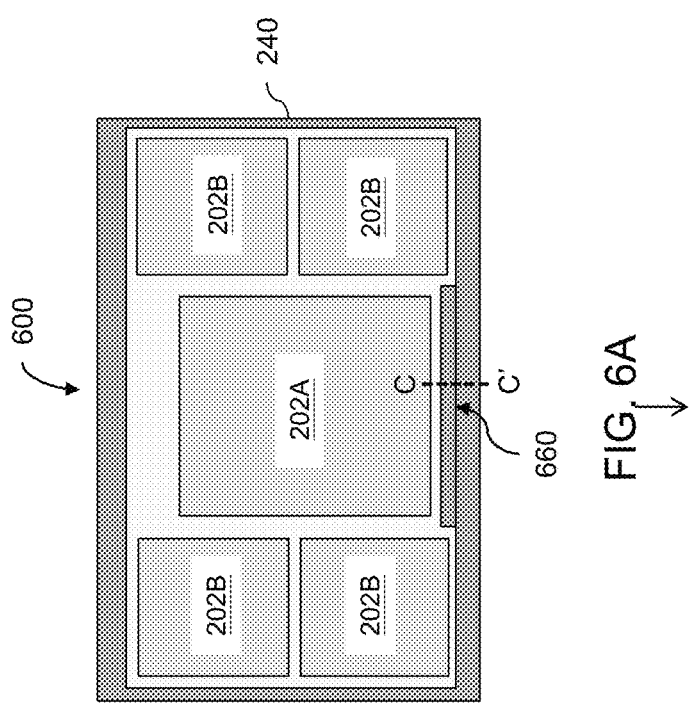
Figure 6C:
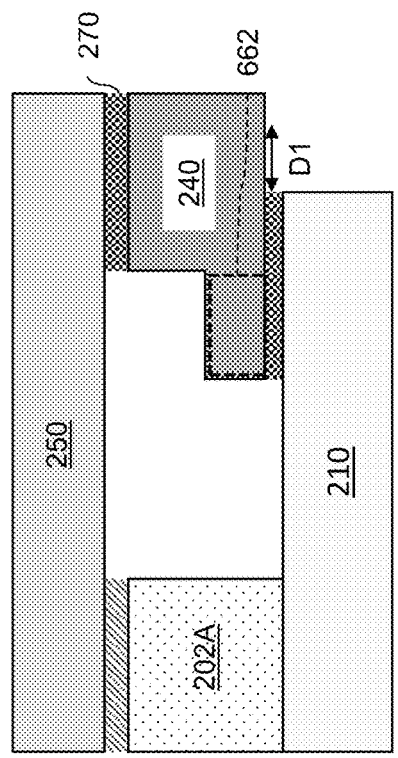

FIG. 6B is a perspective cross-sectional view taken along line CC' of FIG. 6A, and FIG. 6C is a vertical cross-sectional view of FIG. 6B.

Figure 6D:
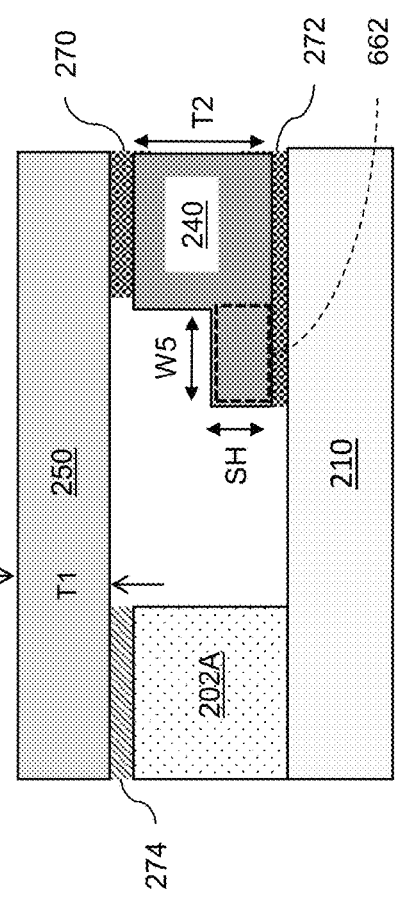

FIG. 6D is a vertical cross-sectional view of an alternative embodiment of the package ring 240 with alternative stress-reduction structure 660.

Figure 7A:
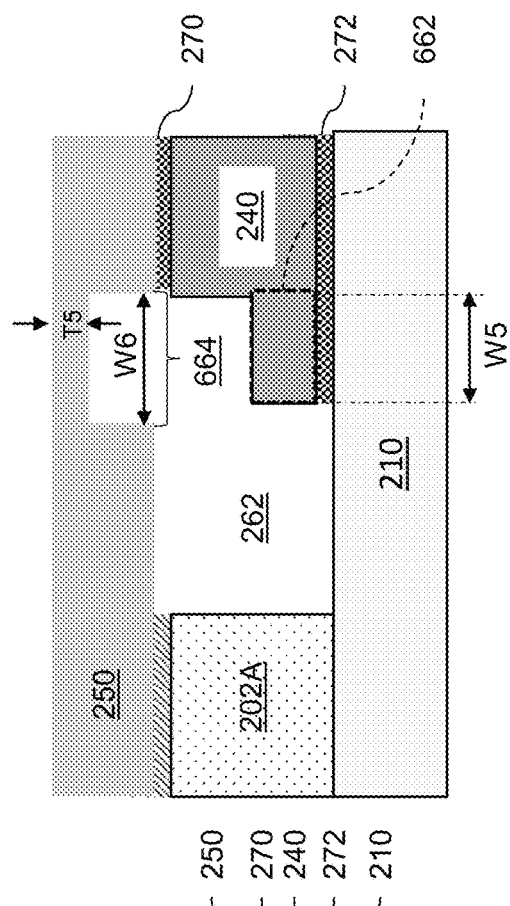
Figure 7B:
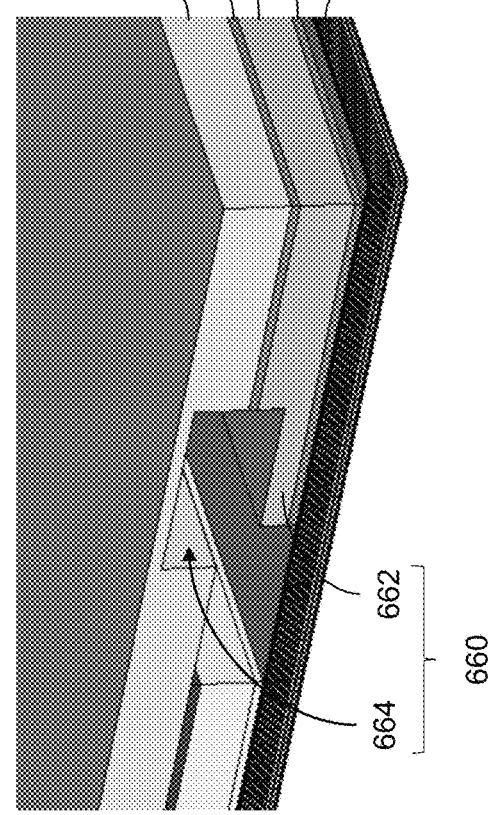

FIG. 7A is a perspective cross-sectional view taken along line CC' of FIG. 6A, showing an alternative embodiment of the stress-reduction structure 660. FIG. 7B is a vertical cross-sectional view of the cross-section of FIG. 7A.

Figure 7C:
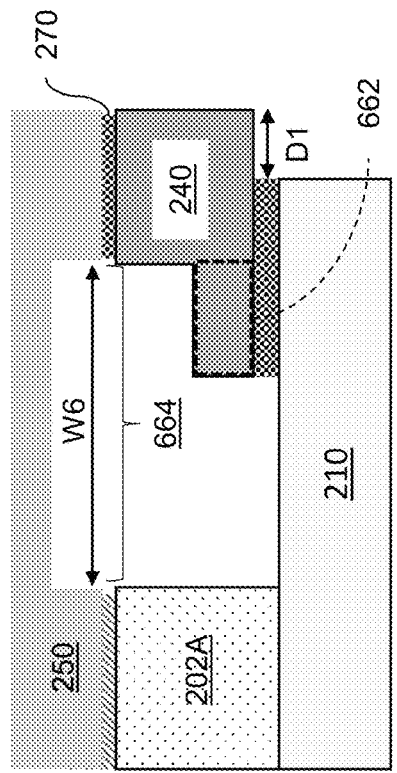

FIG. 7C is a vertical cross-sectional view taken along line CC' of FIG. 6A, showing another alternative embodiment of the stress-reduction structure 660.

Figure 8A:
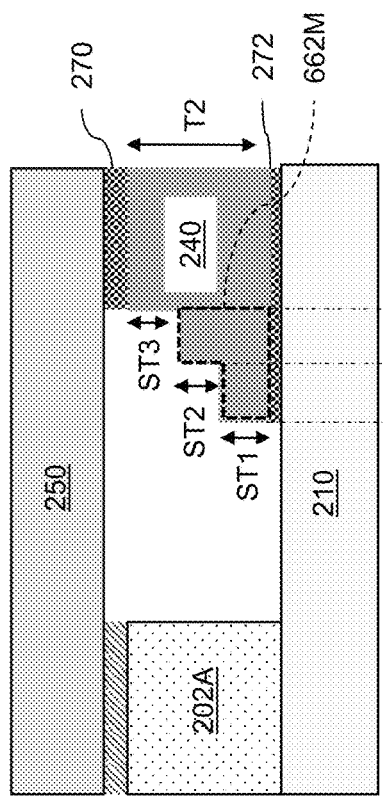

FIG. 8A is a vertical cross-sectional view taken along line CC' of FIG. 6A, showing an alternative embodiment of the stress-reduction structure 660.

Figure 8B:
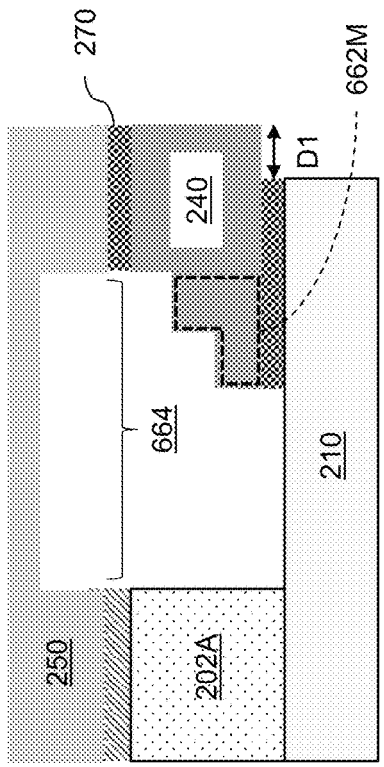

FIG. 8B is a vertical cross-sectional view taken along line CC' of FIG. 6A, showing another alternative embodiment of the stress-reduction structure 660

FIGS. 9A-9D are simplified horizontal cross sectional views of the semiconductor package 600, showing various locations where stress-reduction structures 660 may be formed, in various embodiments.

Figure 10:
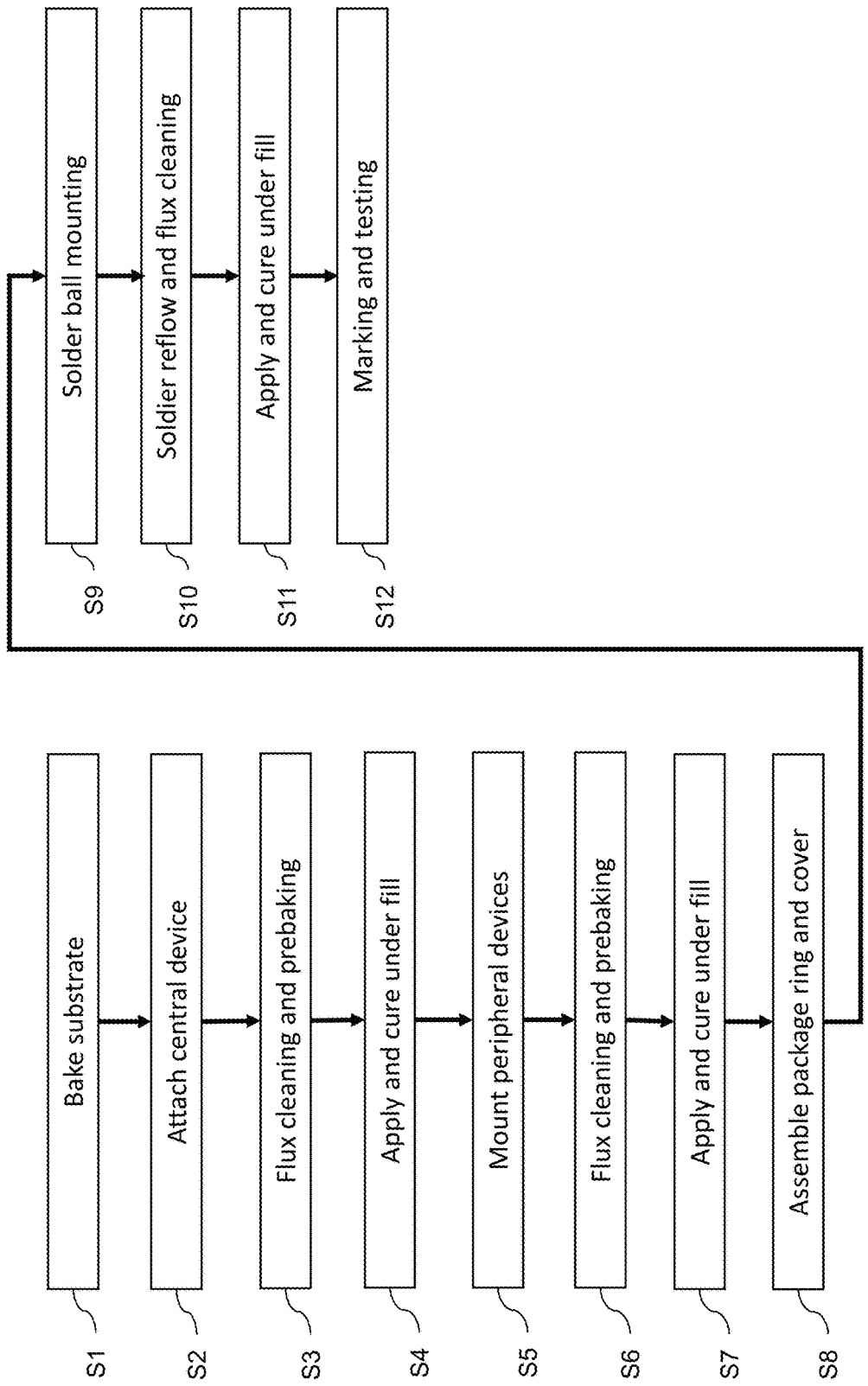

FIG. 10 is a flow diagram showing operations of a method of forming a semiconductor package, according to various embodiments of the present disclosure.

Figure 11:
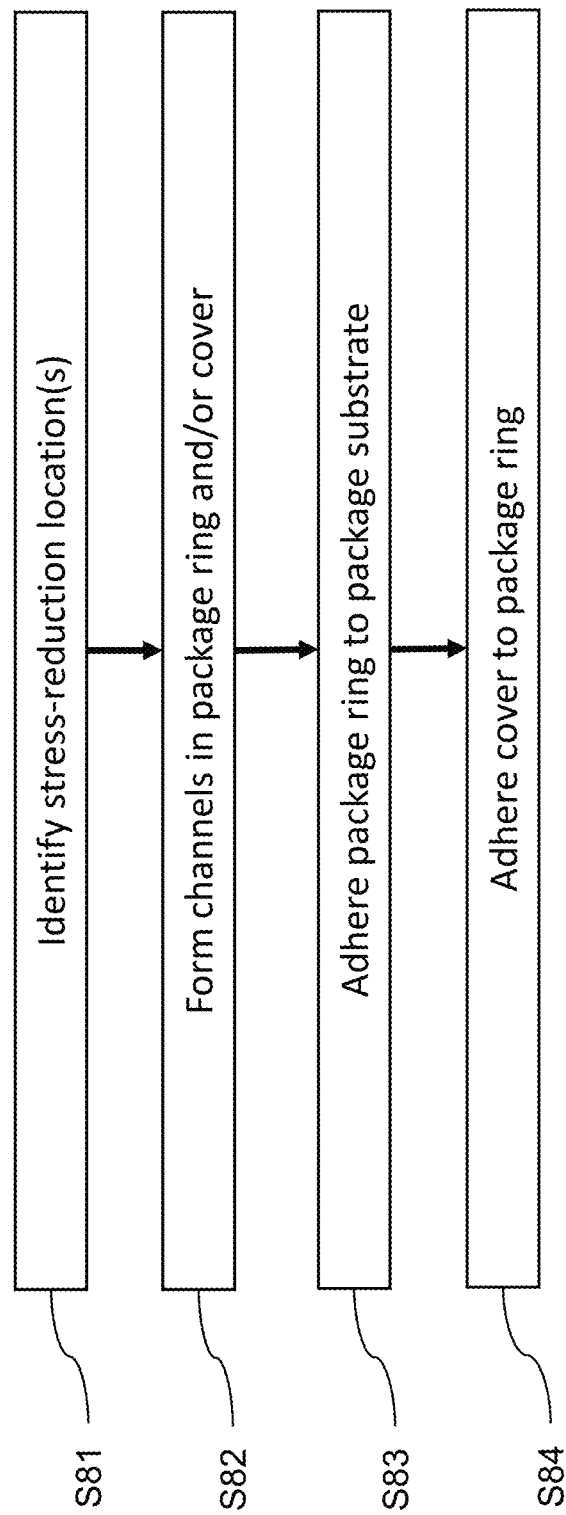

FIG. 11 is a flow diagram showing operations of that may be included in operation S8 of FIG. 10, in order to assemble the package ring and cover in the semiconductor package 200, according to various embodiments of the present disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

A conventional semiconductor package may include multiple semiconductor dies arranged on a package substrate. During testing and/or assembly of a semiconductor package, the semiconductor package may be subjected to thermal stress, which may result in adhesive stress and/or delamination. In particular, thermal stress may be concentrated at particular locations, depending upon the arrangement of the dies on the package substrate. Accordingly, various embodiments provide semiconductor packages that include stress-reduction structures configured to reduce the amount of thermal stress applied to the semiconductor packages.

Figure 1:
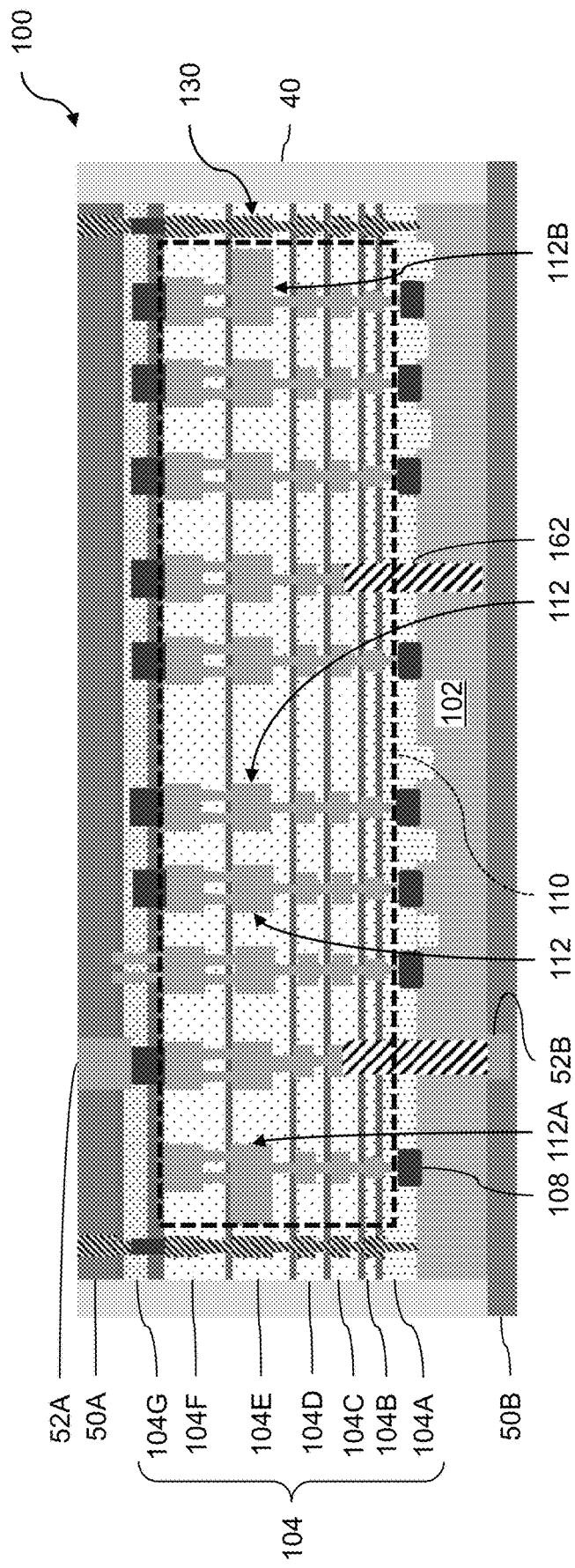
FIG. 1 is a vertical cross-sectional view of a semiconductor die 100, according to various embodiments of the present disclosure.

FIG. 1 is a cross-sectional view of a die 100, according to various embodiments of the present disclosure. Referring to FIG. 1, the die 100 may be, for example, an application-specific integrated circuit (ASIC) chip, an analog chip, a sensor chip, a wireless and radio frequency chip, a voltage regulator chip or a memory chip. In some embodiments, the die 100 may be an active component or a passive component. In some embodiments, the die 100 includes a planar semiconductor substrate 102, a dielectric structure 104, an interconnect structure 110 embedded within the dielectric structure 104, a seal ring 130, and a TSV structure 162.

In some embodiments, the semiconductor substrate 102 may include an elementary semiconductor such as silicon or germanium and/or a compound semiconductor such as silicon germanium, silicon carbide, gallium arsenic, indium arsenide, gallium nitride or indium phosphide. In some embodiments, the semiconductor substrate 102 may be a semiconductor-on-insulator (SOI) substrate. In various embodiments, the semiconductor substrate 102 may take the form of a planar substrate, a substrate with multiple fins, nanowires, or other forms known to people having ordinary skill in the art. Depending on the requirements of design, the semiconductor substrate 102 may be a P-type substrate or an N-type substrate and may have doped regions therein. The doped regions may be configured for an N-type device or a P-type device.

In some embodiments, the semiconductor substrate 102 includes isolation structures defining at least one active area, and a device layer may be disposed on/in the active area. The device layer may include a variety of devices. In some embodiments, the devices may include active components, passive components, or a combination thereof. In some embodiments, the devices may include integrated circuits devices. The devices may be, for example, transistors, capacitors, resistors, diodes, photodiodes, fuse devices, or other similar devices. In some embodiments, the device layer includes a gate structure, source/drain regions, spacers, and the like.

The dielectric structure 104 may be disposed on a front side of the semiconductor substrate 102. In some embodiments, the dielectric structure 104 may include silicon oxide, silicon oxynitride, silicon nitride, a low dielectric constant (low-k) material, or a combination thereof. Other suitable dielectric materials may be within the contemplated scope of disclosure. The dielectric structure 104 may be a single layer or a multiple-layer dielectric structure. For example, as shown in FIG. 1B, the dielectric structure 104 may include multiple dielectric layers 104A-104F, which may include a substrate oxide layer 104A, inter-layer dielectric (ILD) layers 104B-104F, and a passivation layer 104G. However, while FIG. 1 illustrates seven dielectric layers, the various embodiments of the present disclosure are not limited to any particular number of layers.

The dielectric structure 104 may be formed by any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like.

An interconnect structure 110 may be formed in the dielectric structure 104. The interconnect structure 110 may include metal features 112 disposed in the dielectric structure 104. The metal features 112 may be any of a variety metal lines and via structures that electrically connect the metal lines of adjacent ILD layers 104B-104F. The metal features 112 may include a connection line 112A that may be used in a die-to-die connection circuit, as discussed in detail below. The metal features 112 may optionally include a second connection line 112B that may be used in a die-to-die connection circuit, as also discussed below.

The interconnect structure 110 may be electrically connected to substrate electrodes 108 disposed on the semiconductor substrate 102, such that the interconnect structure 110 may electrically interconnect connect semiconductor devices formed on the semiconductor substrate 102. In some embodiments, the substrate electrodes 108 may include metal gates of transistors formed in the device layer of the semiconductor substrate 102.

The interconnect structure 110 may be formed of any suitable electrically conductive material, such as copper (Cu), a copper alloy, aluminum (Al), an aluminum alloy, silver (Ag), combinations thereof, or the like. For example, the interconnect structure 110 may be preferably include copper at an atomic percentage greater than 80%, such as greater than 90% and/or greater than 95%, although greater or lesser percentages of copper may be used.

In some embodiments, barrier layers (not shown) may be disposed between the metal features 112 and the dielectric layers of dielectric structure 104, to prevent the material of the metal features 112 from migrating to the semiconductor substrate 102. The barrier layer may include Ta, TaN, Ti, TiN, CoW, or combinations thereof, for example. Other suitable barrier layer materials may be within the contemplated scope of disclosure.

The seal ring 130 may extend around the periphery of the die 100. In other words, the seal ring 130 may be disposed adjacent to side surfaces of the die 100. For example, the seal ring 130 may be disposed in the dielectric structure 104 and may laterally surround the interconnect structure 110. The seal ring 130 may be configured to protect the interconnect structure 110 from contaminant diffusion and/or physical damage during device processing, such as plasma etching and/or deposition processes.

The seal ring 130 may include copper at an atomic percentage greater than 80%, such as greater than 90% and/or greater than 95% although greater or lesser percentages may be used. The seal ring 130 may include conductive lines and via structures that are connected to each other, and may be formed simultaneously with the conductive lines 112L and via structures 112V of the metal features 112 of the interconnect structure 110. The seal ring 130 may be electrically isolated from the metal features 112.

In some embodiments, the metal features 112 and/or the seal ring 130 may be formed by a dual-Damascene process or by multiple single Damascene processes. Single-Damascene processes generally form and fill a single feature with copper per Damascene stage. Dual-Damascene processes generally form and fill two features with copper at once, e.g., a trench and overlapping through-hole may both be filled with a single copper deposition using dual-Damascene processes. In alternative embodiments, the metal features 112 and/or the seal ring 130 may be may be formed by an electroplating process.

For example, the Damascene processes may include patterning the dielectric structure 104 to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden) that is disposed on top of the dielectric structure 104.

In particular, the patterning, metal deposition, and planarizing processes may be performed for each of the ILD layers 104B-104F, in order to form the interconnect structure 110 and/or the seal ring 130. For example, ILD layer 104B may be deposited and patterned to form openings. A deposition process may then be performed to fill the openings in the ILD layer 104B. A planarization process may then be performed to remove the overburden and form metal features 112 in the ILD layer 104B. These process steps may be repeated to form the ILD layers 104C-104F and the corresponding metal features 112, and thereby complete the interconnect structure 110 and/or seal ring 130.

A front side bonding layer 50A may be disposed over the dielectric structure 104. The front side bonding layer 50A may be formed of a dielectric bonding material such as an epoxy resin. A front side bonding pad 52A may be formed in the front side bonding layer 50A. A backside bonding layer 50B may be formed on the backside of the semiconductor substrate 102. However, in some embodiments, the backside bonding layer 50B may be omitted, depending on the intended location of the die 100. A backside bonding pad 52B may be formed in the backside bonding layer 50B. The front side bonding layer 50A and the backside bonding layer 50B may be formed by depositing a bonding material using any suitable deposition method. Suitable bonding materials may include silicon oxide or binding polymers as described above, or the like, such as an epoxy, a polyimide (PI), a benzocyclobutene (BCB), and a polybenzoxazole (PBO). Other suitable bonding materials may be within the contemplated scope of disclosure. The front side die bonding pads 52A and the backside bonding pads 52B may be electrically conductive features formed of the same materials as the metal features 112. For example, the front side die bonding pads 52A and the backside bonding pads 52B may include tungsten (W), copper (Cu), a copper alloy, aluminum (Al), an aluminum alloy, or a combination thereof, or the like.

A dielectric encapsulation (DE) layer 40 may be formed on side surfaces of the die 100. The DE layer 40 may be formed of a dielectric material, such as silicon oxide, silicon nitride, a molding compound including a resin and a filler, or the like. The DE layer 40 may be formed by any suitable deposition process, such as spin-coating, lamination, deposition or the like.

The TSV structure 162 may be disposed in a trench formed in the semiconductor substrate 102. The TSV structure 162 may be electrically connected to the interconnect structure 110 and the backside bonding pad 52B. The TSV structure 162 may be formed of suitable electrically conductive material, such as, copper (Cu), a copper alloy, aluminum (Al), an aluminum alloy, silver (Ag), tungsten (W), combinations thereof, or the like. For example, the TSV structure 162 may preferably include copper at an atomic percentage greater than 80%, such as greater than 90% and/or greater than 95%, although greater or lesser percentages of copper may be used.

In some embodiments, a barrier layer may be disposed between the TSV structures 162 and the semiconductor substrate 102 and the dielectric structure 104. The barrier layer may include Ta, TaN, Ti, TiN, CoW, or combinations thereof, for example. Other suitable barrier layer materials may be within the contemplated scope of disclosure.

Semiconductor Package Stress-Reduction Structures

Figure 2A:
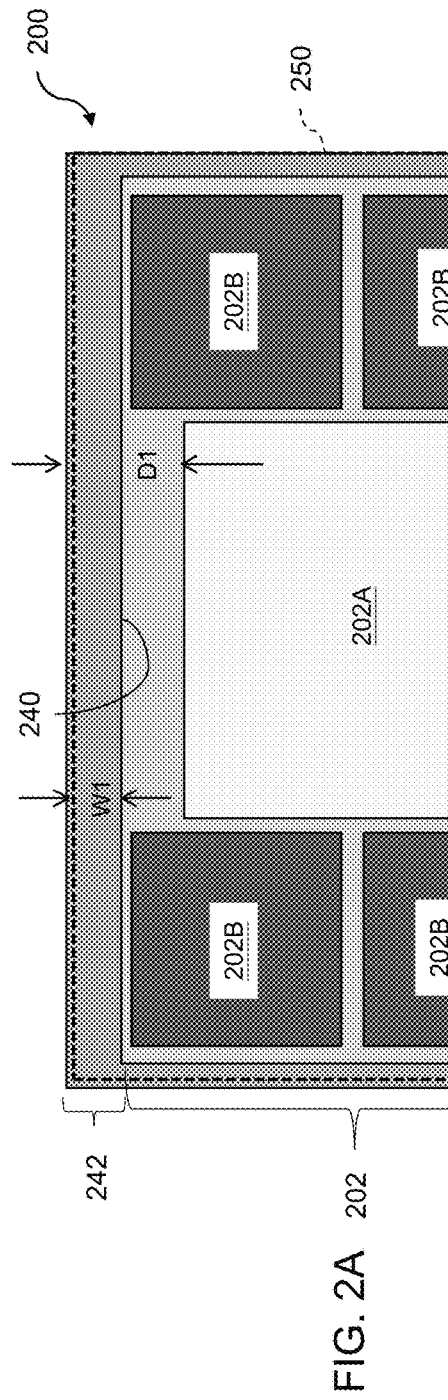
FIG. 2A is a simplified horizontal cross sectional view of a semiconductor package 200 taken along line BB' of FIG. 2B, according to various embodiments of the present disclosure.
Figure 2B:
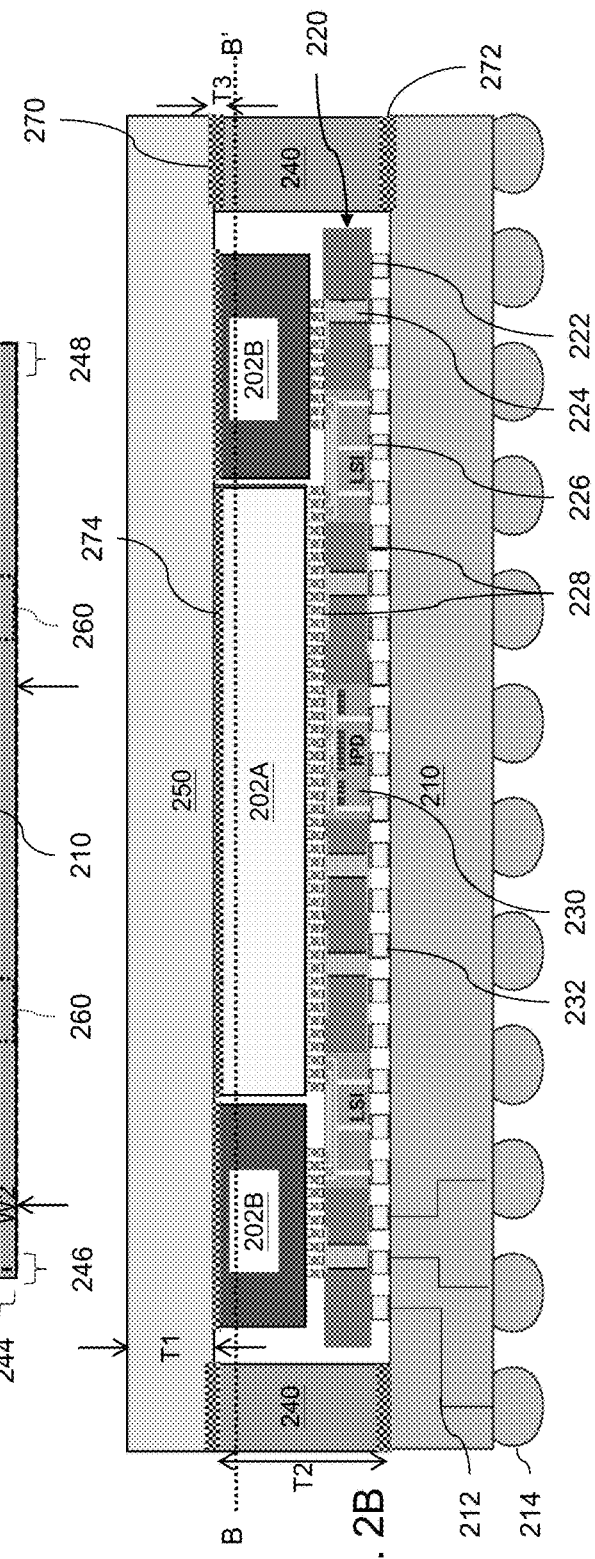
FIG. 2B is a vertical cross-sectional view taken along line AA' of FIG. 2A.
Figure 2C:
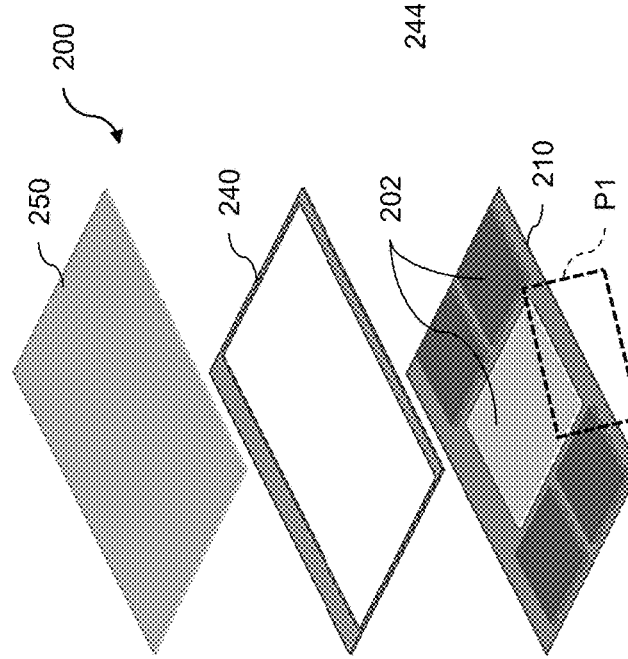
FIG. 2C is an exploded perspective view of the semiconductor package 200 of FIG. 2A.

FIG. 2A is a simplified horizontal cross section view of a semiconductor package 200 along line BB' in FIG. 2B, according to various embodiments of the present disclosure. FIG. 2B is a cross-sectional view taken along line AA' of FIG. 2A, and FIG. 2C is an exploded perspective view of the semiconductor package 200 of FIG. 2A.

Referring to FIGS. 1, 2A, 2B, and 2C, the semiconductor package 200 may include a package substrate 210, an interposer 220 disposed on the package substrate 210, semiconductor devices 202 disposed on the interposer 220, a package ring 240 disposed on the perimeter of the package substrate 210, a cover 250 disposed on the package ring 240, covering the semiconductor devices 202, a cover adhesive 270, a substrate adhesive 272, and stress-reduction structures 260 formed in the perimeter of the semiconductor package 200.

The package substrate 210 may be any suitable package substrate, such as a polymer substrate, organic resin substrate, a laminate substrate, a printed circuit board, or the like. Common laminate substrates include FR4 substrates and bismaleimide-triazine (BT) substrates. The package substrate 210 may include metal package traces 212 that are electrically connected to corresponding package balls 214 (e.g., soldier balls).

The interposer 220 may be configured to electrically connect the semiconductor devices 202 to the package substrate 210. For example, the interposer 220 may be a silicon interposer, a redistribution layer (RDL) interposer, a chip-on-wafer-silicon (CoWoS) interposer, or the like. CoWoS interposers may include chip-on-wafer-silicon redistribution layer (CoWoS-R) interposers and chip-on-wafer-silicon local silicon interconnect bridge (CoWoS-L) interposers, for example. As shown in FIG. 2B, in some embodiments the interposer 220 may be a CoWoS-L interposer including an organic molding material 222, through interconnect via (TIV) structures 224, local silicon interconnect (LSI) structures 226, RDL structures 228, and/or integrated passive devices (IPDs) 230. The RDL structures 228 may be electrically connected to the package traces 212 by metal bumps 232, such as copper bumps.

The package ring 240 may extend around the perimeter of the package substrate 210, so as to surround the interposer 220 and the semiconductor devices 202. The package ring 240 may be bonded to the cover 250 by the cover adhesive 270, and may be bonded to the package substrate 210 by substrate adhesive 272. The cover adhesive 270 may also bond the semiconductor devices 202 to the cover 250. The package ring 240 may be formed of a first metal or metal alloy, such as stainless steel (e.g., SUS304 or SUS440). The package ring 240 may have a thickness T2 ranging from 50 μm to 3000 μm, such as from 100 μm to 3000 μm, although thicker or thinner package rings 240 may be used. In some embodiments, the package ring 240 may include a first side 242, and opposing second side 244, a third side 246, and an opposing fourth side 248. The widths of one or more of the sides 242, 244, 246, 248 may vary from one side to another. For example, the first side 242 of the package ring 240 may have a width W1 that is greater than a width W2 of the second side 244. The widths of the third side 246 and the fourth side 248 may be the same, and may be equal to the width W2, in some embodiments.

The cover 250, which may also be referred to as a lid, may be formed of a second metal or metal alloy having high thermal conductivity, such as copper, gallium, titanium, alloys thereof, or the like. The cover 250 may have a thickness T1 ranging from 50 μm to 3500 μm, such as from 100 μm to 3000 μm, although greater or lesser thicknesses may be used.

The cover adhesive 270 and the substrate adhesive 272 may be formed of any suitable adhesive material having a high thermal conductivity, such as DOWSIL SE 4450 adhesive, manufactured by Dow Corp., for example. The cover adhesive 270 and/or the substrate adhesive 272 may be applied in layers have a thickness T3 ranging from 20 μm to 250 μm, such as from 30 μm to 200 μm, although greater or lesser thicknesses may be used.

In various embodiments, the semiconductor devices 202 may each include a semiconductor die 100, as shown in FIG. 1, or a stack of multiple interconnected semiconductor dies 100. The semiconductor devices 202 may be any suitable type of semiconductor device, depending on the intended function of the semiconductor package 200. For example, the semiconductor devices 202 may include system-on-chip (SoC) devices, flip chips (FC), three-dimensional integrated circuits (3DICs), wafer level packages (WLPs), package on package (PoP), system on integrated circuit (SoIC) devices, or the like. In some embodiments, the semiconductor devices 202 may include logic devices and memory devices, such as high bandwidth memory (HBM) devices, dynamic random access memory (DRAM) devices, or the like. In some embodiments, the semiconductor devices 202 may include a central device 202A and peripheral devices 202B arranged around the central device 202A.

In some embodiments, the central device 202A may be eccentrically arranged on the package substrate 210. In particular, a distance D1 between a first side of the central device 202A and an adjacent first edge of the package substrate 210 may be greater than a distance D2 between an opposing second side of the central device 202A and an adjacent second edge of the package substrate 210.

In some embodiments, an optional thermal interface material 274 may be disposed on one or more of the semiconductor devices 202, in order to enhance thermal coupling with the cover 250. For example, the thermal interface material 274 may be a thermal paste, a thermal adhesive, a thermal gap filler, a thermally conductive pad, thermal tape, a metal thermal interface material, or the like.

The semiconductor package may include one or more stress-reduction structures 260. As discussed in detail below, the stress-reduction structures 260 may be disposed in areas of the semiconductor package 200 that experience high concentrations of stress, such as thermal stress. For example, the stress-reduction structures 260 may be at least partially formed in the second side 244 of the package ring 240 and may be disposed adjacent to corners of the central device 202A.

Figure 3A:
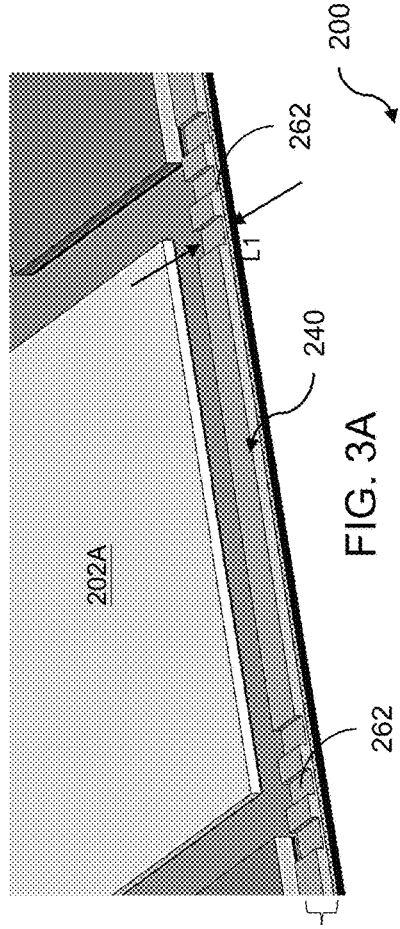
FIG. 3A is an enlarged view of a portion P1 of FIG. 2C.
Figure 3B:
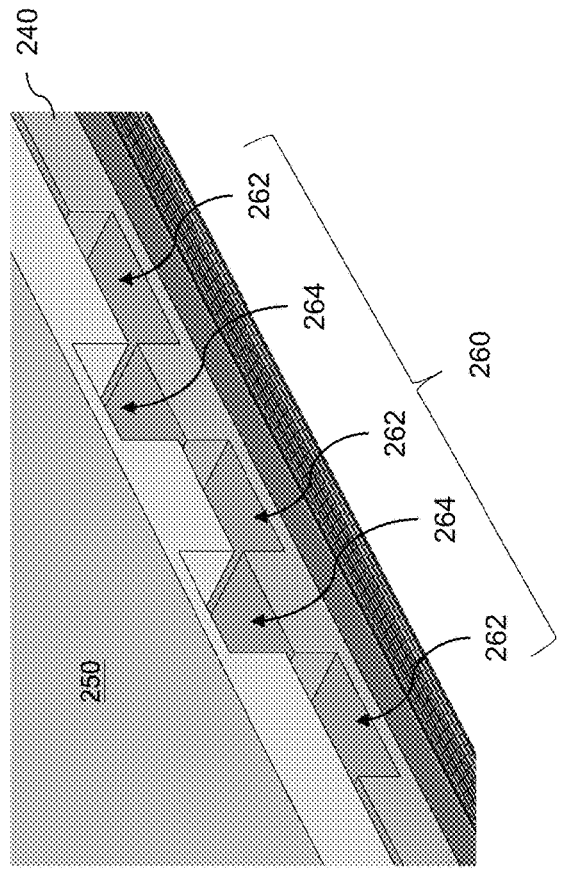
FIG. 3B is an enlarged perspective view of a stress-reduction structure 260 including first channels 262 shown in FIG. 3A, according to various embodiments of the present disclosure.
Figure 3C:
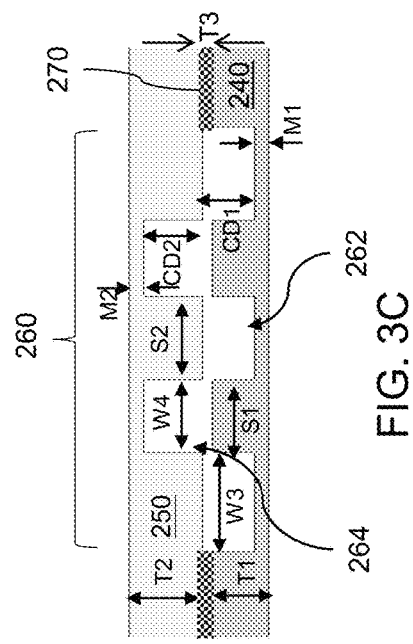
FIG. 3C is a side view of the stress-reduction structure 260 of FIG. 3B.

FIG. 3A is an enlarged view of a portion P1 of FIG. 2C. FIG. 3B is an enlarged perspective view of a stress-reduction structure 260 including first channels 262 shown in FIG. 3A, according to various embodiments of the present disclosure. FIG. 3C is a side view of the stress-reduction structure 260 of FIG. 3B.

Referring to FIGS. 3A-3C, each stress-reduction structure 260 may include first channels 262 formed in the package ring 240 and second channels 264 formed in the cover 250. In particular, the first channels 262 may be formed in an upper surface of the second side 244 of the package ring 240, and the second channels 264 may be formed in a lower surface of a portion of the cover 250 that overlaps with the first channels 262.

In some embodiments, the first channels 262 and the second channels 264 may be offset from one another in a vertical direction perpendicular to a plane of the package substrate 210. For example, the first channels 262 and the second channels 264 may overlap one another by less than 10%, in the vertical direction, based on the total areas of the first channels 262 and the second channels 264.

The first channels 262 and the second channels 264 may be formed in the package ring 240 and the cover 250 using any suitable process, such as by milling, laser drilling, etching, or the like. The stress-reduction structures 260 may include any suitable number of first channels 262 and second channels 264. For example, the stress-reduction structures 260 may include from 2 to 30 first channels 262 and from 2 to 30 second channels 264.

The first channels 262 and the second channels 264 may have a rectangular vertical cross-section, in some embodiments. In other words, the first channels 262 and the second channels 264 may have perpendicular sidewalls and bottoms. However, as discussed in detail below with respect to FIGS. 4A-4D, the first channels 262 and the second channels 264 may have any suitable cross-sectional shape.

The first channels 262 may have a vertical depth CD1 ranging from 1 μm to 1750 μm, such as from 100 μm to 1600 μm, or from 500 μm to 1500 μm, for example. The second channels 264 may have a vertical depth CD2 ranging from 1 μm to 1750 μm, such as from 100 μm to 1600 μm, or from 500 μm to 1500 μm, for example. The first channels 262 may have a channel width W3 ranging from 1 μm to 1750 μm, such as from 100 μm to 1600 μm, or from 500 μm to 1500 μm, for example. The second channels 264 may have a channel width W4 ranging from 1 μm to 1750 μm, such as from 100 μm to 1600 μm, or from 500 μm to 1500 μm, for example. The channel widths W3 and W4 may represent a maximum width of the first channels 262 and the second channels 264, taken in a direction perpendicular to the lengths thereof.

The first channels 262 may have a separation distance S1 ranging from 1 μm to 1750 μm, such as from 100 μm to 1600 μm, or from 500 μm to 1500 μm, for example. The second channels 264 may have a separation distance S2 ranging from 1 μm to 1750 μm, such as from 100 μm to 1600 μm, or from 500 μm to 1500 μm, for example.

The first channels 262 may have a minimum thickness M1 ranging from 0 μm to thickness T1—100 μm, such as from 1 μm to 125 μm, or from 50 μm to 100 μm, for example. The second channels 264 may have a minimum thickness M2 ranging from 0 μm to less than thickness T2, such as from 1 μm to 125 μm, or from 50 μm to 100 μm, for example.

In some embodiments, the channel width W3 and the channel width W4 may be the same or different. In some embodiments, the separation distance S1 may be within +/−10%, such as within +/−5%, of the channel width W4, and the separation distance S2 may be within +/−10%, such as within +/−5% of the channel width W3.

The first channels 262 may have a length L1 that is equal to the width W2 (see FIG. 2A) of the second side 244 of the package ring 240. The second channels 264 may have a length that is within +/−5% of the length L1 of the first channels 262.

In some embodiments, the stress-reduction structures 260 may include an unequal number of first channels 262 and second channels 264. For example, the stress-reduction structures 260 may include N first channels 262 and N+1 second channels 264, or N second channels and N+1 first channels 262, where N is a number ranging from 2 to 50, such as from 2 to 30. For example, the stress-reduction structures 260 may include three first channels 262 and two second channels 264, as shown in FIGS. 3B and 3C. However, in other embodiments, the stress-reduction structures 260 may include an equal number of first channels 262 and second channels 264.

In various embodiments, thermal stress may be generated due to differences in the thermal coefficient of expansion of the package substrate 210, the package ring 240, and/or the cover 250. The first channels 262 of the stress-reduction structures 260 may locally increase the flexibility of the package ring 240, and the second channels 264 may locally increase the flexibility of the cover 250. The cover adhesive 270 may be disposed outside of the stress-reduction structures 260, which may also increase the flexibility thereof. The increased flexibility provided by the stress-reduction structures 260 may reduce an amount of stress that would otherwise be applied to the cover adhesive 270 and/or the substrate adhesive 272.

Accordingly, one or more of the stress-reduction structures 260 may be formed in areas where stress is concentrated in the semiconductor package 200. As such, the stress-reduction structures 260 may be configured to prevent and/or reduce delamination of the semiconductor package 200, due to thermal stress. In other words, the stress-reduction structures 260 may prevent damage to the cover adhesive 270 and/or the substrate adhesive 272, thereby preventing and/or reducing thermal stress damage to the semiconductor package 200.

Figure 4A:
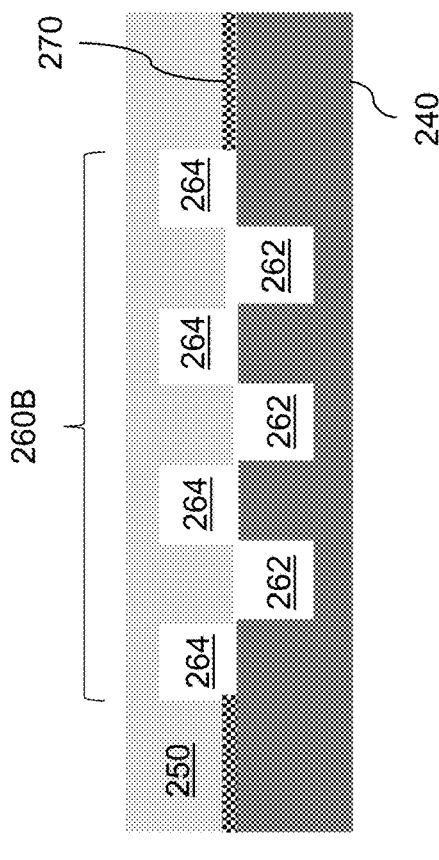
FIGS. 4A-4E are side views of different stress-reduction structures, according to various embodiments of the present disclosure.
Figure 4B:
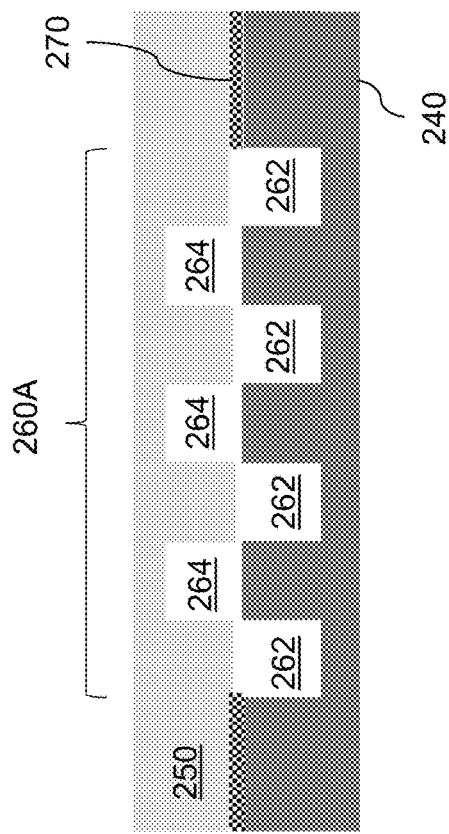

FIGS. 4A-4E are vertical cross-sectional views of different stress-reduction structures 260 (260A, 260B, 260C, 260D, and 260E), according to various embodiments of the present disclosure. Referring to FIG. 4B, a stress-reduction structure 260A may include a higher number of first channels 262 than second channels 264. For example, the stress-reduction structure 260A may include four first channels 262 and three second channels 264.

As shown in FIG. 4B, a stress-reduction structure 260B may include higher number of second channels 264 than first channels 262. For example, the stress-reduction structure 260B may include four second channels 264 and three first channels 262.

Figure 4C:
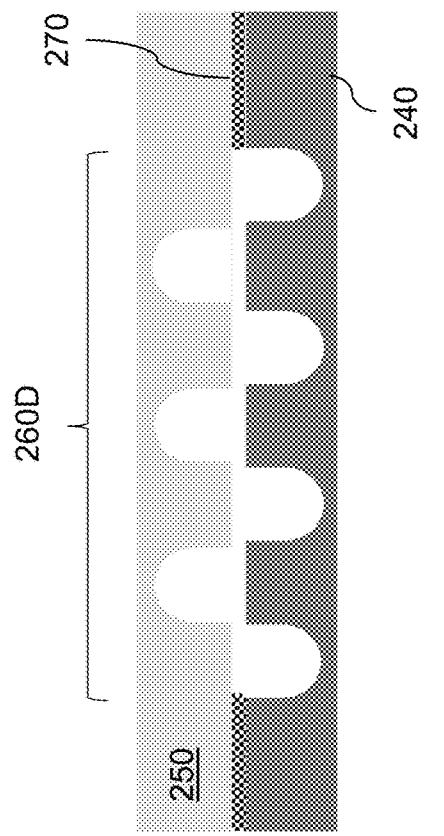

As shown in FIG. 4C, a stress-reduction structure 260C may include V-shaped first channels 262 and second channels 264, rather than rectangular channels. In other words, the first channels 262 and second channels 264 may have triangular vertical cross-sections, such that the stress-reduction structure 260C has a saw-tooth or zig-zag channel configuration.

Figure 4D:
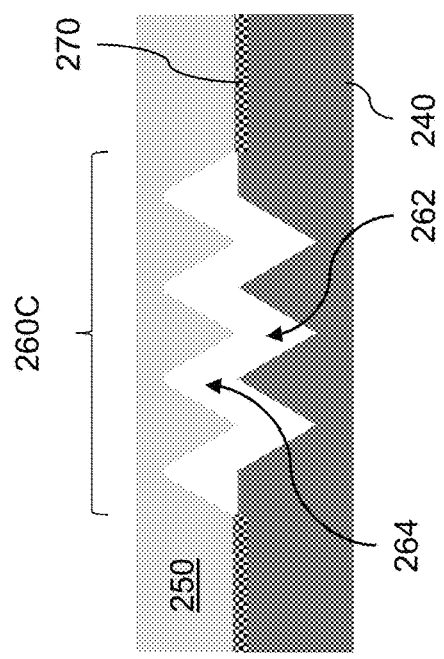
Figure 4E:
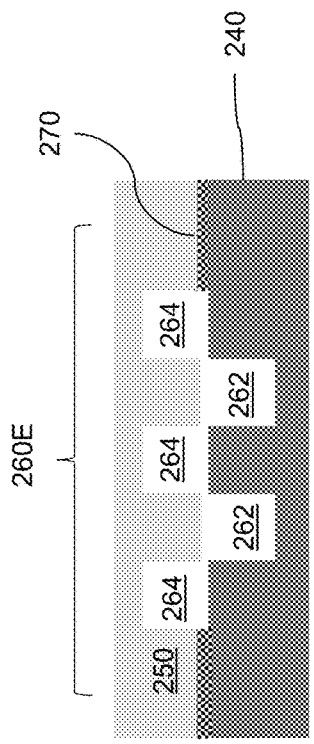

As shown in FIG. 4D, a stress-reduction structure 260D may include U-shaped first channels 262 and second channels 264. In other words, the first channels 262 and second channels 264 may have semicircular vertical cross-sections. As shown in FIG. 4E, a stress-reduction structure 260D may include may include two lower channels 262 and three upper channels 264, in some embodiments.

While various channel configurations are shown in FIGS. 4A-4E, the present disclosure is not limited thereto. In particular, any suitable channel configuration may be within the scope of the present disclosure.

Figure 5A:
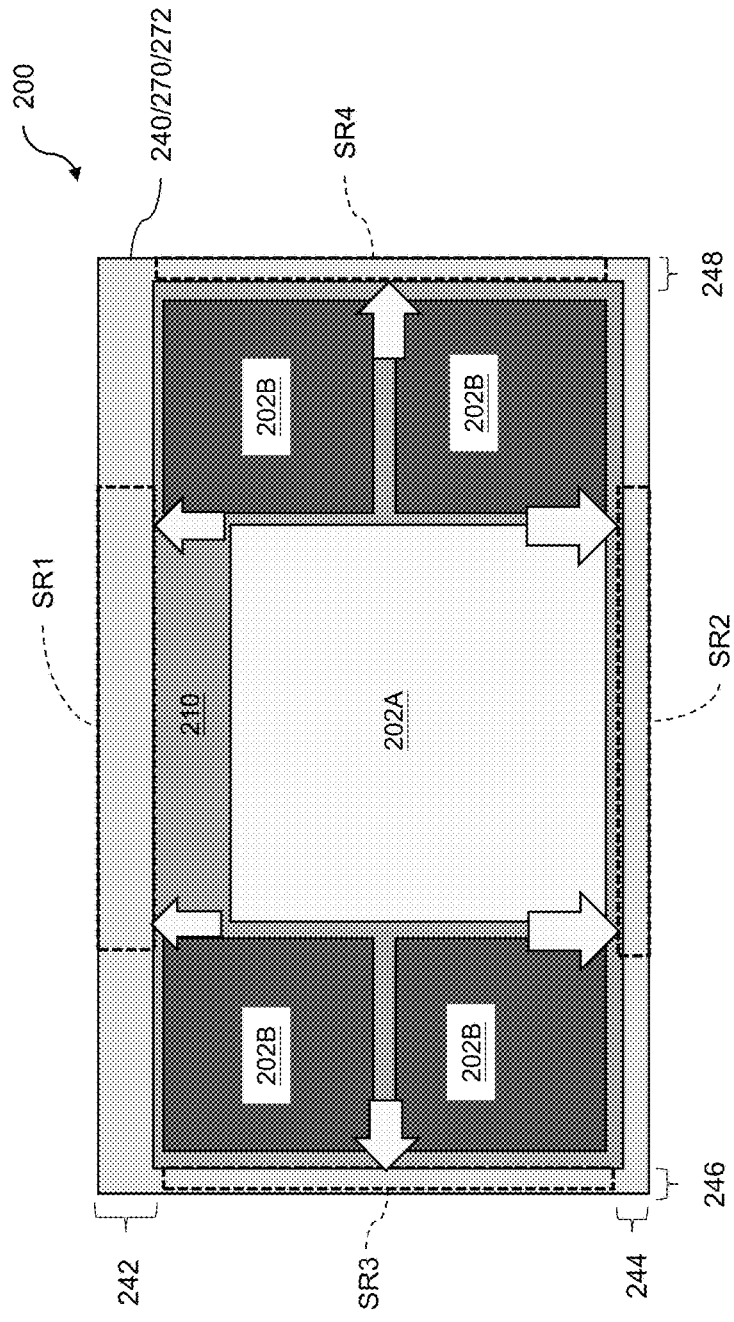
FIG. 5A is a simplified horizontal cross sectional view of a semiconductor package 200 taken along line BB' of FIG. 2B, which identifies regions where thermal stress may be concentrated.

FIG. 5A is a simplified horizontal cross sectional view of the semiconductor package 200 of FIG. 2A, which identifies regions where thermal stress may be concentrated. FIGS. 5B-5I are simplified top views of the semiconductor package 200, showing various locations where stress-reduction structures 260 may be formed, in various embodiments.

Referring to FIGS. 2B and 5A, when the semiconductor package 200 is subjected to changes in temperature, such as during testing and/or assembly of the package substrate 210, thermal stress may be concentrated in a first stress region SR1, a second stress region SR2, a third stress region SR3, and/or a fourth stress region SR4, which extend along edges of the semiconductor package 200. As such, the cover adhesive 270 and/or the substrate adhesive 272 may be subjected to relatively high amounts of thermal stress in the first stress region SR1, the second stress region SR2, the third stress region SR3, and/or the fourth stress region SR4.

The arrows of FIG. 5A indicate areas where the highest concentrations of thermal stress may occur within the stress regions SR1-SR4. For example, the highest stress concentration may occur in areas near corners of the central device 202A and the peripheral devices 202A, and/or between adjacent corners of the peripheral devices 202B. In particular, the second stress region SR2, which is located at the second side 244 of the package ring 240, may experience greater thermal stress that the first stress region SR1, which may be located at the first side 242 of the package ring 240. It is believed that the eccentric location of the central device 202A may contribute to this elevated thermal stress in the second stress region SR2. In addition, the smaller widths of the second side 244 and corresponding portions of the cover adhesive 270 and substrate adhesive 272 may also contribute to higher levels of stress accumulation.

Figure 5C:
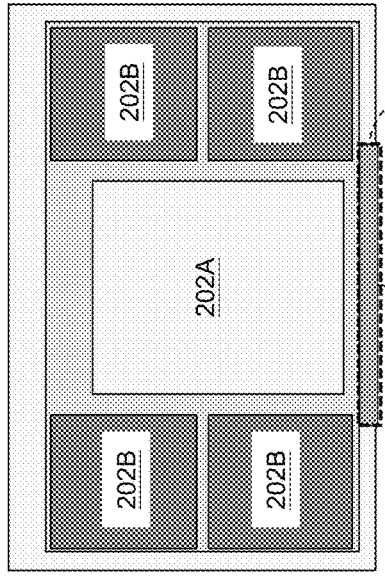
Figure 5E:
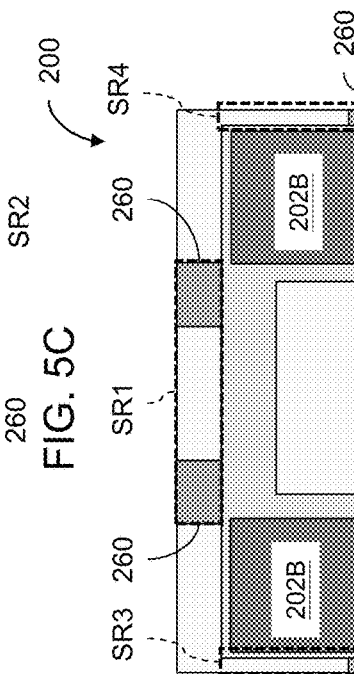
Figure 5B:
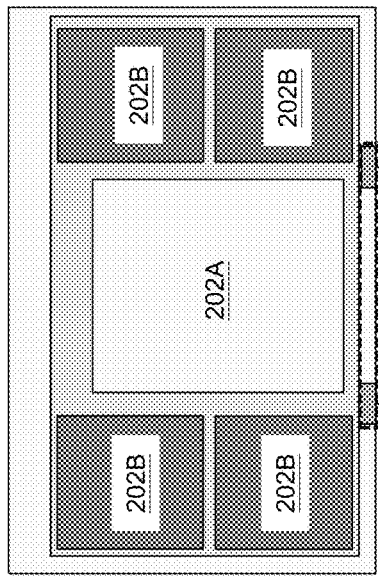

According to various embodiments, stress-reduction structures 260 may be formed in areas where high levels of thermal stress occurs. In particular, as shown in FIG. 5B, two stress-reduction structures 260 may be formed on opposing ends of the second stress region SR2 where, as shown in FIG. 5A, the highest concentrations of thermal stress occur within the second stress region SR2. As shown in FIG. 5C, a single stress-reduction structure 260 may occupy the entirety of the second stress region SR2, in some embodiments.

Figure 5D:
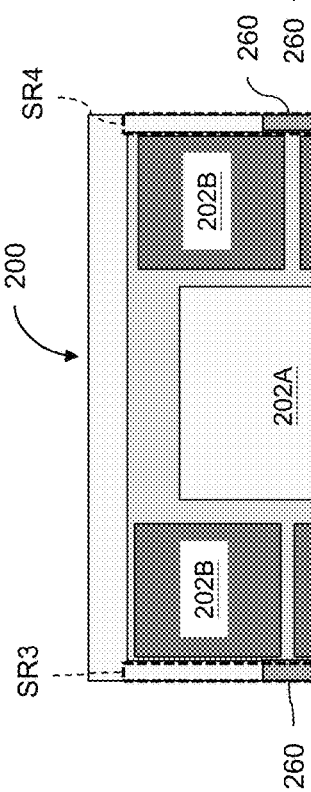

As shown in FIG. 5D, three stress-reduction structures 260 may be formed in the second stress region SR2, and additional stress-reduction structures 260 may be disposed in the third stress region SR3 and the fourth stress region SR4, in areas where the highest concentrations of thermal stress occur therein. As shown in FIG. 5E, two additional stress-reduction structures 260 may be disposed on opposing ends of the first stress region SR1, in addition to stress-reduction structures 260 formed in the second stress region SR2, the third stress region SR3, and/or the fourth stress region SR4.

As shown in FIG. 5F, two relatively small stress-reduction structures 260 may be disposed adjacent to corners of the central device 202A. As shown in FIG. 5G, two relatively large stress-reduction structures 260 may be disposed adjacent to corners of the central device 202A. As shown in FIG. 5H, three relatively small stress-reduction structures 260 may be included, with two of the stress-reduction structures 260 being disposed adjacent corners of the central device 202A, and one stress-reduction structure 260 being disposed there between, adjacent the middle of the central device 202A. As shown in FIG. 5G, three relatively large stress-reduction structures 260 may be included, with two of the stress-reduction structures 260 being disposed adjacent to adjacent corners of the central device 202A and one stress-reduction structure 260 being disposed there between, adjacent the middle of the central device 202A.

While various possible locations are shown for the stress-reduction structures 260, the present disclosure is not limited to any particular locations. For example, stress-reduction structures 260 may be formed in any areas of a semiconductor package where stress-reduction is beneficial. In some embodiments, the stress-reduction structures 260 may reduce stress applied to the cover adhesive 270 and/or the substrate adhesive 272 by at least 4%, such as by at least 5%, or at least 6%.

FIG. 6A is a simplified horizontal cross sectional view of a semiconductor package 600 including an alternative stress-reduction structure 660, according to various embodiments of the present disclosure. FIG. 6B is a perspective cross-sectional view taken along line CC' of FIG. 6A, and FIG. 6C is a side view of the cross-section of FIG. 6B. FIG. 6D is a vertical cross-sectional views of an alternative embodiment of the package ring 240 with alternative stress-reduction structure 660.

Referring to FIGS. 6A-6C, the semiconductor package 600 may be similar to the semiconductor package 200 of FIGS. 2A and 2B. As such, only the differences there between will be discussed in detail. For example, the semiconductor package 600 may include a package substrate 210, a central device 202A, peripheral devices 202B, the package ring 240, a cover 250, a cover adhesive 270, and a substrate adhesive 272. The semiconductor package 600 may optionally include a thermal interface material 274 (not shown in FIGS. 6A-6C).

The cover 250 and may have a thickness T1 ranging from 50 µm to 3500 µm, such as from 100 µm to 3000 µm, although greater or lesser thicknesses may be used. The package 240 may have a thickness T2 ranging from 50 µm to 3500 µm, such as from 100 µm to 3000 µm, although greater or lesser thicknesses may be used. The thicknesses T1 and T2 may be the same or different.

The stress-reduction structure 660 may be configured to increase the stiffness of the package ring 240 and/or to locally increase the flexibility of the cover 250, in order to reduce stress that may be applied to the cover adhesive 270 and/or the substrate adhesive 272. The stress reduction structure 660 may include a stepped extension 662 that extends from an inner edge of the package ring 240, towards the central device 202A. The stepped extension 662 may have a step height SH ranging from 50 µm to 750 µm, such as from 100 µm to 500 µm, although greater or lesser thicknesses may be used. The stepped extension 662 may have a width W5 ranging from 1 µm to 800 µm, such as from 10 µm to 600 µm, or from 100 µm to 500 µm.

In some embodiments, the stepped extension 662 and the package ring 240 may be formed from the same material. In other embodiments, the stepped extension 662 and the package ring 240 may be formed from different materials. In some embodiments, the stepped extension 662 may be integrally formed with the package ring 240. In other words, the stepped extension 662 may be an extension of the package ring 240 that protrudes inwardly from a remainder of the package ring 240, toward one or more of the semiconductor devices 202.

Referring to FIG. 6D, in some embodiments the package ring 240 may be configured to extend beyond the perimeter of the package substrate 210. In particular, a portion of the package ring 240 may be cantilevered from the package substrate 210, such that the package ring 240 extends laterally outside of an edge of the package substrate 210. The package ring 240 may extend laterally outside of an edge of the package substrate 210 by a distance D1 ranging from 0.5 µm to 1000 µm, such as from 1 µm to 600 µm, although greater or lesser distances may be used. As such, the size of the package ring 240 may be increased without increasing the size of the package substrate 210, thereby increasing the overall strength of the package ring 240.

FIG. 7A is a perspective cross-sectional view taken along line CC' of FIG. 6A, showing an alternative embodiment of the stress-reduction structure 660. FIG. 7B is a vertical cross sectional view of the perspective cross-section of FIG. 7A. FIG. 7C is an alternative embodiment cross-sectional view taken along line CC' of FIG. 6A, illustrating an alternative embodiment of the stress-reduction structure 660.

Referring to FIGS. 7A and 7B, the stress-reduction structure 660 may include a stepped extension 662, as described with respect to FIGS. 6B and 6C, and a channel 664 formed in the cover 250. The channel 664 may extend lengthwise in the same direction as the stepped extension 662. The length of the channel 664 may be the same as, or within +/−5% of, the length of the stepped extension 662. The channel 664 may at least partially overlap with the stepped extension 662 in a vertical direction perpendicular to the plane of the package substrate 210. For example, in some embodiments the channel 664 may completely cover the stepped extension 662 in the vertical direction. The channel 664 and the stepped extension 662 may extend lengthwise, in parallel directions.

A thickness T5 of the cover adjacent the channel 664 may range from 50 µm to 800 µm, such as from 100 µm to 500 µm, or from 200 µm to 300 µm. In some embodiments, the channel 664 may have a width W6 that is the same or approximately the same as the width W5 of the stepped extension 662. However, in other embodiments, the width W6 of the channel 664 may be greater or less than the width W5 of the stepped extension 662.

For example, as shown in FIG. 7C, the channel 664 may extend, widthwise, from an inner edge of the package ring 240 to an opposing edge of the central device 202A. In some embodiments, the package ring 240 may optionally be cantilevered so as to extend beyond the perimeter of the package substrate 210 by the distance D1.

FIG. 8A is a vertical cross-sectional view taken along line CC' of FIG. 6A, showing an alternative embodiment of the stress-reduction structure 660. FIG. 8B is a cross-sectional view taken along line CC' of FIG. 6A, showing another alternative embodiment of the stress-reduction structure 660.

Referring to FIGS. 8A and 8B, the stress-reduction structure 600 may include a multi-stepped extension 662M. For example, the multi-stepped extension 662M may include two or more steps. The multi-stepped extension 662M may have a first step height ST1 and a second step height ST2, taken in a vertical direction perpendicular to a plane of the package substrate 210. A third step height ST3 may represent a difference between a maximum height (e.g., total thickness) of the extension 662 (ST1+ST2) and the thickness T2 of the package ring 240. In various embodiments, the first step height ST1, the second step height ST2, and the third step height ST3 may be the same or different and may range from about 50 μm to 750 μm, such as from 100 μm to 500 μm, although greater or lesser thicknesses may be used.

The multi-stepped extension 662M may have a first step width SW1 and a second step width SW2. The first step width SW1 and the second step width SW2 may be the same or different and may range from about 50 μm to 750 μm, such as from 100 μm to 500 μm, although greater or lesser widths may be used. The multi-stepped extension 662M may have a total width W5 as described above with respect to the extension 662.

Referring to FIG. 8B, the stress-reduction structure 600 may include the multi-stepped extension 662M and a channel 664 formed in the cover 250, as described with respect to FIGS. 7A-7C. In some embodiments, the package ring 240 may be optionally cantilevered from an edge of the package substrate 210 by the distance D1, as described with respect to FIG. 7C.

FIGS. 9A-9D are simplified horizontal cross sectional views of the semiconductor package 600, showing locations where stress-reduction structures 660 may be formed, according to various embodiments of the present disclosure. Referring to FIGS. 9A-9D, the stress-reduction structures 660 may include a stepped extension 662, a multi-stepped extension 662M, and/or a channel 664, as described with respect to FIGS. 6A-8B.

Figure 9A:
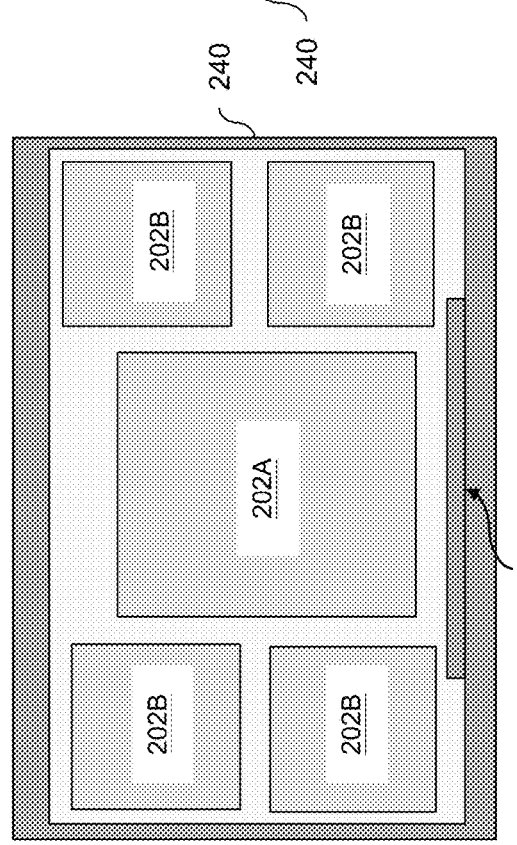
Figure 9B:
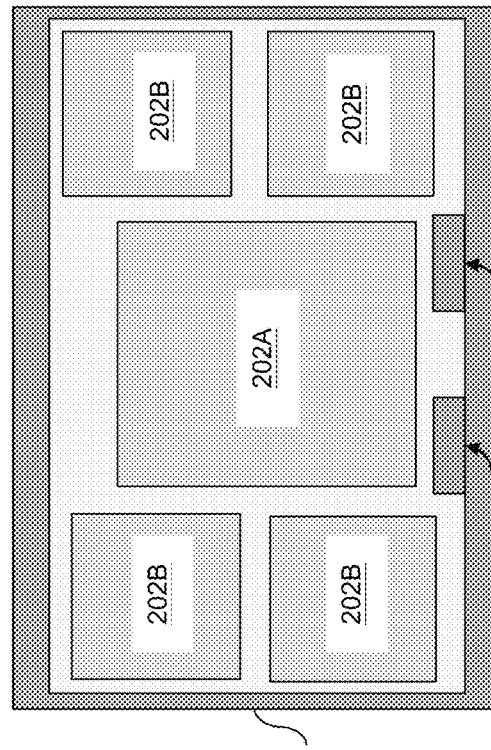

Referring to FIG. 9A, the semiconductor package 600 may include a stress-reduction structure 660 that extends along the central device to corners of adjacent peripheral devices 202B. Referring to FIG. 9B, the semiconductor package 600 may include two stress-reduction structures 660 that extend along adjacent corners of the central device 202A.

Figure 9D:
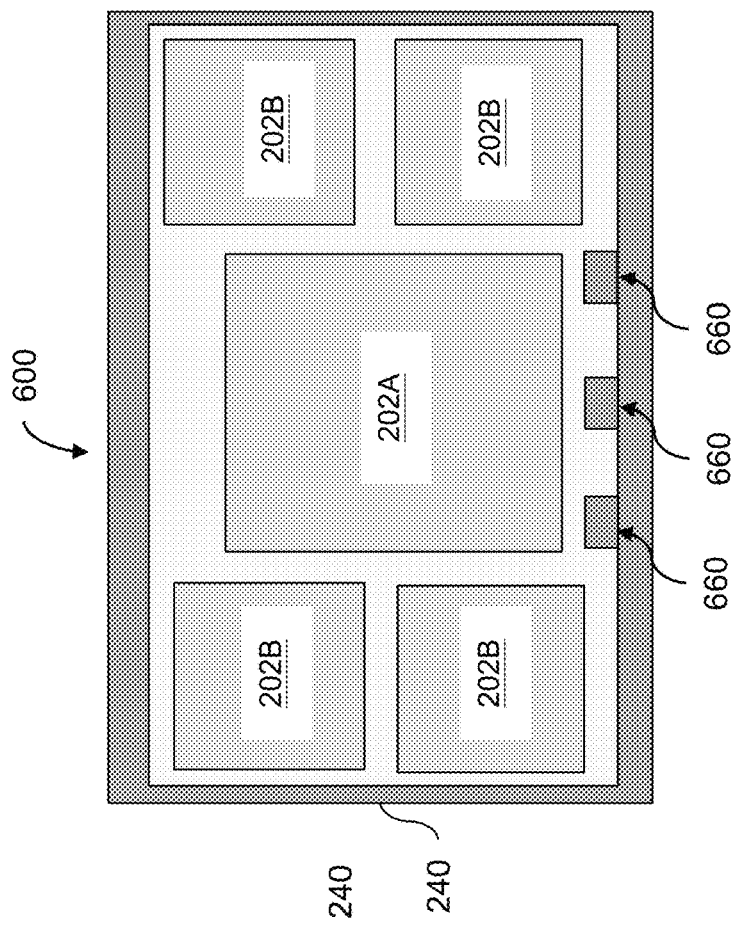
Figure 9C:
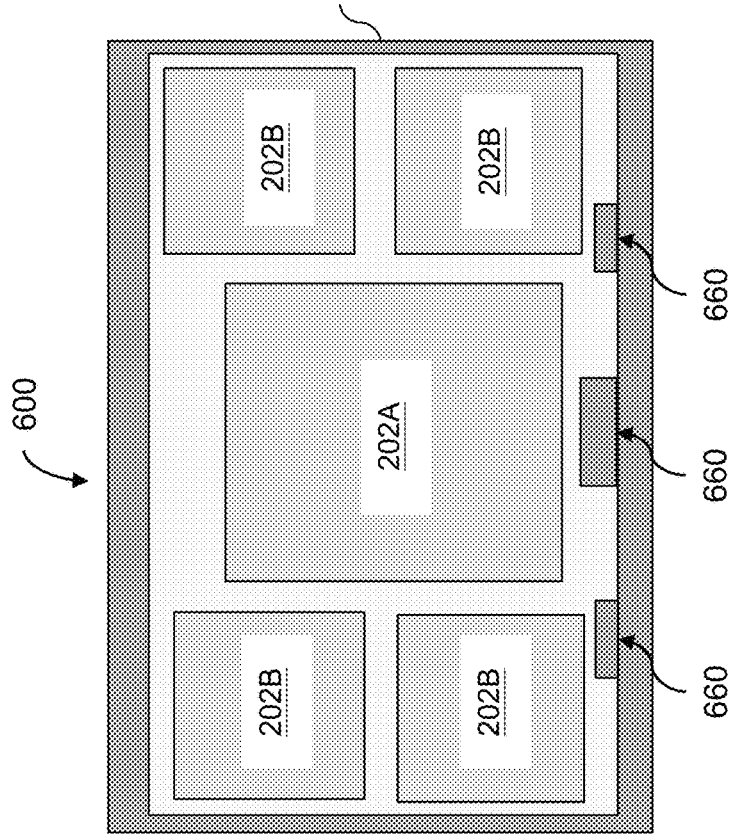

Referring to FIG. 9C, the semiconductor package 600 may include two stress-reduction structures 660 disposed adjacent to corners of two of the peripheral devices 202B, and a stress-reduction structure 660 disposed adjacent to the central device 202A. In some embodiments, the stress-reduction structure 660 disposed adjacent to the central device 202A may have a larger width than the stress-reduction structures 660 disposed adjacent to corners of two of the peripheral devices 202B.

Referring to FIG. 9D, the semiconductor package 600 may include three stress-reduction structures 660 disposed adjacent to the central device 202A. For example, the stress-reduction structures 660 may be equally spaced along an adjacent edge of the central device 202A.

While various stress-reduction structure locations are described, the present disclosure is not limited to any particular number or location of stress-reduction structures 660. For example, stress-reduction structures 660 may be located in any of the stress regions SR1-SR4 shown in FIG. 5A.

FIG. 10 is a flow diagram illustrating the operations of a method of forming a semiconductor package, according to various embodiments of the present disclosure. The method may be used to form either of the previously described semiconductor packages 200, 600.

Referring to FIG. 10, in operation S1 a package substrate may be baked. In operation S2, a central chip may be attached to the substrate. For example, the central chip may be attached using micro bumps, or the like. In operation S3, a cleaning process may be performed to remove excess solder, and the substrate may be prebaked.

In operation S4, an underfill material may be applied below the central device and then cured. In operation S5, peripheral devices may be mounted to the substrate, using micro bumps, for example, and a reflow process may be performed. In operation S6, the flux cleaning and prebaking process may be repeated.

In operation S7, an underfill material may be applied below the peripheral devices and cured. In operation S8, a package ring and a cover may be attached to the substrate, using a substrate adhesive and a cover adhesive. In operation S9, solder balls may be formed on the bottom of the substrate. In operation S10, a reflow process may be performed to reflow the solder balls, and a flux cleaning process may be performed to remove excess solder material. In operation S11, an underfill material may be applied around the soldier balls and cured to form a semiconductor package. In operation S12, the semiconductor package may be marked and tested.

FIG. 11 is a flow diagram showing operations of that may be included in operation S8 of FIG. 10, in order to assemble the package ring and cover in the semiconductor package 200, according to various embodiments of the present disclosure. Referring to FIGS. 2A-2C and 11, in operation S81 stress-reduction locations in a semiconductor package may be identified. For example, a semiconductor package may be subjected to thermal testing to identify locations where thermal stress is concentrated, in order to identify suitable stress-reduction locations when constructing a semiconductor package 200. In the alternative, stress-reduction locations may be predicted based on locations of semiconductor devices 202 on the package substrate 210.

In operation S82, stress-reduction structures (first channels 262 may be formed in a package ring 240 and second channels 264 formed in the cover 250) may be formed in locations based on the identified stress-reduction structure locations. In particular, the first channels 262 may be formed in an upper surface of the package ring 240, and second channels 264 may be formed in a lower surface of the cover 250, using any suitable method, such as machining laser cutting, etching, milling, or the like.

In operation S83, a substrate adhesive 272 may be applied to the perimeter of the package substrate 210. The package ring 240 may be disposed on the substrate adhesive 272, such that the lower surface of the package ring 240 contacts the substrate adhesive 272. In addition, the first channels 262 may be aligned with the identified stress-reduction locations. The substrate adhesive 272 may then be cured, for example, using heat or UV light.

In operation S84, a cover adhesive 270 may be formed on the package ring 240 by applying a cover adhesive 270. In various embodiments, the cover adhesive 270 may not be applied to the first channels 262. The cover 250 may be disposed on the cover adhesive 270, such that the lower surface of the cover 250 contacts the cover adhesive 270, and the second channels 264 are aligned with the first channels 262, in the stress-reduction locations, thereby forming the stress-reduction structures 260. The cover adhesive 270 may then be cured to complete the semiconductor package 200.

Various embodiments provide a semiconductor package 200 that may include: a package substrate 210; semiconductor devices 202 disposed on the package substrate 210; a package ring 240 disposed on a perimeter of package substrate 210 surrounding the semiconductor devices 202; a cover 250 disposed over the package ring 240 and the semiconductor devices 202; a cover adhesive 270 bonding the cover 250 to the package ring 240; and a stress-reduction structure 260 that may include first channels 262 formed in an upper surface of the package ring 240 and second channels 264 formed in a lower surface of a portion of the cover 250 that overlaps with the first channels 262, the stress-reduction structure 260 configured to reduce thermal stress applied to the cover adhesive 270 by at least 4%.

In one embodiment, the cover adhesive 270 may be disposed along the package ring 240 and cover 250 that do not contain the stress-reduction structure 260 (e.g., the stress-reduction structure is free from the cover adhesive). In one embodiment, the first channels 262 may be offset from the second channels 264 in the vertical direction. In one embodiment, the semiconductor package 200 may include a substrate adhesive 272 bonding the package ring 240 to the package substrate 210, wherein the stress-reduction structure 260 may be configured to reduce thermal stress applied to the substrate adhesive 272. In one embodiment, the package ring 240 may include: a first side 242 that extends along a first edge of the package substrate 240; and a second side 244 that extends along an opposing second edge of the package substrate 240; the semiconductor devices 202 may include: peripheral devices 202B; and a central device 202A may be disposed between the peripheral devices 202B, the central device 202A being disposed closer to the second edge of the package substrate 210 than to the first edge of the package substrate 210; and the first channels 262 may be formed in the second side 244 of the package ring 240. In one embodiment, the stress-reduction structure 260 may extend along a corner of the central device 202A and an adjacent corner of one of the peripheral devices 202B. In one embodiment, a length of the first channels 262 may be equal to a width of the second side 244 of the package ring 240; and a length of the second channels 264 may be within +/−5% of the length of the first channels 262. The length of the first channels, the length of the second channels, and the width of the second side of the package ring are taken in a direction parallel to the plane of the package substrate. In one embodiment, the package substrate 210 may include an organic material; the package ring 240 may include a first metal; and the cover 250 may include a second metal, wherein the cover is separated from the package ring. In one embodiment, the semiconductor devices 202 comprise at least one of system-on-chip (SoC) devices, flip chips (FC), three-dimensional integrated circuits (3DICs), wafer level packages (WLPs), package-on-package (PoP) devices, system on integrated circuit (SoIC) devices, or a combination thereof. In one embodiment, the first channels 262 and the second channels 264 may have a rectangular cross-section, a triangular cross-section, or a U-shaped cross-section, taken in a vertical direction perpendicular to a plane of the package substrate. The first channels 262 and the second channels 264 may communicate with each other.

Various embodiments provide a semiconductor package 200 that may include: a package substrate 210; semiconductor devices 202 disposed over the package substrate 210, the semiconductor devices 202 may include peripheral devices 202B and a central device 202A disposed between the peripheral devices; a package ring 240 disposed on a perimeter of the package substrate 210 surrounding the semiconductor devices 202; a substrate adhesive 272 bonding the package substrate 210 to the package ring 240; a cover 250 disposed over the package ring 240 and the semiconductor devices 202; a cover adhesive 270 bonding the cover 250 to the package ring 240; and stress-reduction structures 260 that comprise channels that extend along the perimeter of the package substrate, between the cover 250 and the package ring 240, and are configured to reduce thermal stress applied to the cover adhesive 270, the substrate adhesive 272, or both the cover adhesive 270 and the substrate adhesive 272, by locally increasing the flexibility of the package ring 240 and the cover 250.

In one embodiment, each stress-reduction structure 260 may include: first channels 262 formed in an upper surface of the package ring 240; and second channels 264 formed in a lower surface of a portion of the cover 250 that overlaps with the first channels 262 in a vertical direction perpendicular to a plane of the package substrate 210. In one embodiment, the central device 202A may be disposed closer to a second edge of the package substrate 210 than to an opposing first edge of the package substrate 210; and the stress-reduction structure 260 extend along the second edge of the package structure, adjacent to respective corners of the central device 202A. In one embodiment, the package ring 240 may include a first side 240 that extends along a first edge of the package substrate 240 and a second side 244 that extends along an opposing second edge of the package substrate 210; and the stress-reduction structures 260 may include first channels 262 that may be formed in the second side of the package ring 240. In one embodiment, at least one of the stress-reduction structures 260 extends along the first edge of the package substrate 210. In one embodiment, the first channels 262 may be offset from the second channels 264 in the vertical direction. In one embodiment, the stress-reduction structure 260 configured to reduce thermal stress applied to the cover adhesive 272, the substrate adhesive 270, or both the cover adhesive 270 and the substrate adhesive 272, by at least 4%. In one embodiment, the cover adhesive 270 may be disposed along the package ring 240 and cover 250 that do not contain the stress-reduction structure 260. In one embodiment, at least two of the stress-reduction structures 260 extend along an opposing third edge and fourth edge of the package substrate 210.

According to various embodiments, a semiconductor package comprises: a package substrate 210; semiconductor devices 202 disposed over the package substrate 210, the semiconductor devices 202 comprising peripheral devices 202B and a central device 202A disposed between the peripheral devices 202B; a package ring 240 disposed on a perimeter of the package substrate 210 surrounding the semiconductor devices 202; a substrate adhesive 272 bonding the package substrate 210 to the package ring 240; a cover 250 disposed over the package ring 240 and the semiconductor devices 202; a cover adhesive 270 bonding the cover 250 to the package ring 240; and a stress-reduction structure 660 comprising an extension 662 that extends from the package ring 240 towards at least one of the semiconductor devices 202, the extension 662 having a first step height, taken in a vertical direction perpendicular to a plane of the package substrate, that is less than a thickness of the package ring 240 taken in the vertical direction.

Various embodiments further provide a method of manufacturing a semiconductor package 200, that may include: identifying stress-reduction locations on a package substrate 210; forming first channels 262 in an upper surface of a package ring 240, and forming second channels 264 in a lower surface of a cover 250; applying a substrate adhesive 272 to a perimeter of the package substrate 210; adhering a lower surface of the package ring 240 to a perimeter of the package substrate 210 using the substrate adhesive 272; applying a cover adhesive 270 to the upper surface of the package ring 240; adhering the cover 250 to the upper surface of the package ring 240 using the cover adhesive 270, such that portions of the cover 250 that include the second channels are disposed in the identified stress-reduction regions and form stress-reduction structures 260, wherein the stress-reduction structures 260 are configured to reduce thermal stress applied to the cover adhesive 270 the substrate adhesive 272, or both the cover adhesive 270 and the substrate adhesive 272 by at least 4%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure

What is claimed is:

1. A semiconductor package, comprising:
a package substrate;
semiconductor devices disposed on the package substrate;
a package ring disposed on a perimeter of the package substrate surrounding the semiconductor devices;
a cover disposed over the package ring and the semiconductor devices;
a cover adhesive bonding the cover to the package ring; and
a stress-reduction structure comprising first channels formed in an upper surface of the package ring and second channels formed in a lower surface of a portion of the cover that overlaps with the first channels in a vertical direction perpendicular to a plane of the package substrate,
wherein the stress-reduction structure is free from the cover adhesive.

2. The semiconductor package of claim 1, wherein the first channels are offset from the second channels in the vertical direction.

3. The semiconductor package of claim 1, further comprising a substrate adhesive bonding the package ring to the package substrate,
wherein the stress-reduction structure is configured to reduce thermal stress applied to the substrate adhesive.

4. The semiconductor package of claim 1, wherein:
the package ring comprises:
a first side that extends along a first edge of the package substrate; and
a second side that extends along a second edge of the package substrate opposing the first edge of the package substrate;
the semiconductor devices comprise:
peripheral devices; and
a central device disposed between the peripheral devices, the central device being disposed closer to the second edge of the package substrate than to the first edge of the package substrate; and
the first channels are formed in the second side of the package ring.

5. The semiconductor package of claim 4, wherein the stress-reduction structure extends along a corner of the central device and an adjacent corner of one of the peripheral devices.

6. The semiconductor package of claim 1, wherein:
a length of the first channels is equal to a width of the second side of the package ring;
a length of the second channels is within +/−5% of the length of the first channels; and
the length of the first channels, the length of the second channels, and the width of the second side of the package ring are taken in a direction parallel to the plane of the package substrate.

7. The semiconductor package of claim 1, wherein:
the package substrate comprises an organic material;
the package ring comprises a first metal; and
the cover comprises a second metal, wherein the cover is separated from the package ring.

8. The semiconductor package of claim 1, wherein the semiconductor devices comprise at least one of system-on-chip (SoC) devices, flip chips (FC), three-dimensional integrated circuits (3DICs), wafer level packages (WLPs), package-on-package (POP) devices, system on integrated circuit (SoIC) devices, or a combination thereof, and the first channels and the second channels communicate with each other.

9. The semiconductor package of claim 1, wherein the first channels and the second channels have a rectangular cross-section, a triangular cross-section, or a U-shaped cross-section, taken in a vertical direction perpendicular to a plane of the package substrate.

10. A semiconductor package, comprising:
a package substrate;
semiconductor devices disposed over the package substrate, the semiconductor devices comprising peripheral devices and a central device disposed between the peripheral devices;
a package ring disposed on a perimeter of the package substrate surrounding the semiconductor devices;
a substrate adhesive bonding the package substrate to the package ring;
a cover disposed over the package ring and the semiconductor devices;
a cover adhesive bonding the cover to the package ring; and
stress-reduction structures that comprise channels extending along the perimeter of the package substrate, between the cover and the package ring, and are configured to reduce thermal stress applied to the cover adhesive, the substrate adhesive, or both the cover adhesive and the substrate adhesive, by locally increasing a flexibility of the package ring and the cover,
wherein the stress-reduction structures are free from the cover adhesive.

11. The semiconductor package of claim 10, wherein:
each stress-reduction structure comprises:
first channels formed in an upper surface of the package ring;
second channels formed in a lower surface of a portion of the cover that overlaps with the first channels in a vertical direction perpendicular to a plane of the package substrate;
the central device is disposed closer to a second edge of the package substrate than to an opposing first edge of the package substrate;
the stress-reduction structures extend along the second edge of the package substrate, adjacent to respective corners of the central device;
the package ring comprises a first side that extends along a first edge of the package substrate and a second side that extends along an opposing second edge of the package substrate;
the stress-reduction structures include first channels that are formed in the second side of the package ring; and at least one of the stress-reduction structures extends along the first edge of the package substrate.

12. The semiconductor package of claim 11, wherein the first channels are offset from the second channels in the vertical direction.

13. The semiconductor package of claim 10, wherein:
at least one of the stress-reduction structures extends along a first edge of the package substrate; and
at least two of the stress-reduction structures extend along an opposing third edge and fourth edge of the package substrate.

14. A semiconductor package, comprising:
a package substrate;
an interposer disposed on the package substrate;
semiconductor devices disposed on and electrically connected to the interposer;
a package ring disposed on a perimeter of the package substrate surrounding the semiconductor devices;
a cover disposed over the package ring and the semiconductor devices; and
stress-reduction structures formed in stress regions located along the perimeter of the semiconductor package and configured to locally increase the flexibility of the package ring and/or the cover,
wherein the stress-reduction structures are free from a cover adhesive.

15. The semiconductor package of claim 14, wherein the stress-reduction structures comprise first channels formed in an upper surface of the package ring.

16. The semiconductor package of claim 15, wherein the stress-reduction structures further comprise second channels formed in a lower surface of portions of the cover that overlap with the first channels in a vertical direction perpendicular to a plane of the package substrate.

17. The semiconductor package of claim 16, further comprising:
a substrate adhesive bonding the package substrate to the package ring,
wherein the stress-reduction structures are configured to reduce thermal stress applied to the cover adhesive, the substrate adhesive, or both the cover adhesive and the substrate adhesive.

18. The semiconductor package of claim 17, wherein the first channels are offset from the second channels in the vertical direction.

19. The semiconductor package of claim 16, wherein the first channels and the second channels have a rectangular cross-section, a triangular cross-section, or a U-shaped cross-section, taken in a vertical direction perpendicular to a plane of the package substrate.

20. The semiconductor package of claim 14, wherein the semiconductor devices comprise at least one of system-on-chip (SoC) devices, flip chips (FC), three-dimensional integrated circuits (3DICs), wafer level packages (WLPs), package-on-package (POP) devices, system on integrated circuit (SoIC) devices, or a combination thereof.

* * * * *